United States Patent [19]

Suzuki

[11] Patent Number: 5,228,114
[45] Date of Patent: Jul. 13, 1993

[54] HEAT-TREATING APPARATUS WITH BATCH SCHEME HAVING IMPROVED HEAT CONTROLLING CAPABILITY

[75] Inventor: Fujio Suzuki, Kanagawa, Japan

[73] Assignee: Tokyo Electron Sagami Limited, Kanagawa, Japan

[21] Appl. No.: 760,919

[22] Filed: Sep. 17, 1991

[30] Foreign Application Priority Data

Oct. 30, 1990 [JP] Japan .................... 2-292754
Oct. 30, 1990 [JP] Japan .................... 2-292755
Oct. 30, 1990 [JP] Japan .................... 2-292757

[51] Int. Cl.$^5$ .................... A21B 2/00; F26B 19/00
[52] U.S. Cl. .................... 392/416; 219/494; 364/557; 118/724; 118/719; 118/712; 374/166; 374/179
[58] Field of Search .................... 392/416–418; 219/486–487, 494, 412; 364/557, 477; 118/724–725, 719, 50.1, 712, 641; 374/166–167, 170, 175, 179, 181

[56] References Cited

U.S. PATENT DOCUMENTS

| | | | |
|---|---|---|---|
| 3,370,120 | 2/1968 | Lasch, Jr. .................... | 219/494 |
| 4,421,974 | 12/1983 | Oota et al. .................... | 219/492 |
| 4,483,631 | 11/1984 | Kydd .................... | 374/141 |
| 4,554,437 | 11/1985 | Wagner et al. .................... | 219/388 |
| 4,588,308 | 5/1986 | Saito .................... | 364/557 |
| 4,711,989 | 12/1987 | Yu .................... | 219/388 |
| 4,716,520 | 12/1987 | Locke, Jr. et al. .................... | 364/477 |
| 4,782,445 | 11/1988 | Pasquini .................... | 219/494 |
| 4,852,544 | 8/1989 | Williams et al. .................... | 219/413 |
| 4,875,042 | 10/1989 | Oku et al. .................... | 374/175 |
| 4,924,073 | 5/1990 | Chiba .................... | 219/411 |
| 4,926,364 | 5/1990 | Brotherton .................... | 364/557 |
| 4,954,684 | 9/1990 | Aoki et al. .................... | 219/411 |
| 5,051,701 | 9/1991 | Kashimoto et al. .................... | 219/494 |

FOREIGN PATENT DOCUMENTS 61-187002  8/1986  Japan .................... 374/179

OTHER PUBLICATIONS

Boerger, F. E. et al., "Diffusion Furnace Control", IBM Technical Disclosure vol. 12, No. 9, Feb. 1970.

Primary Examiner—Bruce A. Reynolds
Assistant Examiner—John A. Jeffery
Attorney, Agent, or Firm—Oblon, Spivak, McClelland, Maier & Neustadt

[57] ABSTRACT

A heat-treating apparatus which heat-treats a multiple of objects such as a plate or the like, with a batch scheme. A reaction chamber houses the multiple of the objects to be treated. An electrical heater is provided outside of the reaction chamber for heat-treating the multiple of objects to be treated at a predetermined temperature. A temperature detector detects a temperature within the reaction chamber and has main and reserve temperature detectors. A damage detector detects damage to the main and reserve temperature detectors. A controller controls the electrical heater normally in accordance with a detection output from the main temperature detector of the temperature detector. When the damage of the main temperature detector is detected by the damage detector, the controller controls the electrical heater in accordance with a detection output from the reserve temperature detector of the temperature detector.

23 Claims, 8 Drawing Sheets

HEAT-TREATING APPARATUS WITH BATCH SCHEME HAVING IMPROVED HEAT CONTROLLING CAPABILITY

BACKGROUND OF THE INVENTION

1. Field of the Invention

The present invention generally relates to a heat-treating apparatus and, more particularly, to an apparatus for heat-treating a multiple of objects such as a plate or the like, for example wafer or base materials of semiconductor or liquid crystal devices, with a batch scheme.

2. Description of the Related Art

Generally, in the manufacturing process of a semiconductor device or a liquid crystal device (LCD), various types of heat treatment processes are practiced.

For example, in the film deposition step or thermal diffusion step of the manufacturing process of a semiconductor device, a batch-scheme heat-treating apparatus, in which a heater is arranged around a reaction tube for housing a multiple of semiconductor wafers as objects to be treated, is used.

In such a batch-scheme heat-treating apparatus, since uniformity of temperature atmosphere must be kept in arrangement positions of the semiconductor wafers, electrical heaters are divided into a plurality of regions, and temperature detectors, e.g., thermocouples are arranged at a plurality of positions outside or inside the reaction tube. Detection signals from the thermocouples are sequentially supplied to a temperature measuring circuit to measure the temperatures of the positions where the respective thermocouples are arranged. An AC power of the order of 100 V and 100 A to be applied to the heater is controlled based on the measured temperatures, thereby controlling the temperature inside the reaction tube to a predetermined value.

In this case, in order to improve the uniformity of the temperature profile in the reaction tube, the interior of the reaction tube is divided into a plurality of zones, and thermocouples are provided in the respective zones. The power to be applied to the heater is controlled in units of zones by temperature measurement by the thermocouples. In this case, a single thermocouple is provided to each zone.

When a thermocouple, as described above, is exposed to a high-temperature atmosphere, e.g., 1,000° C. or more for a long period of time, damage such as a disconnection or short circuiting is caused due to so-called thermal fatigue. For this reason, although a thermocouple is generally housed in a ceramic protection tube, a sufficient protection is not obtained for the thermocouple against a high-temperature atmosphere, and the damage described above often occurs.

In a heat-treating apparatus which performs temperature control by a plurality of thermocouples as described above, assume that damage such as a disconnection or short circuiting occurs in a single thermocouple. Then, an abnormal power is supplied to the heater, or power supply to the heater is shut off. As a result, an atmosphere of a predetermined temperature for the object to be treated cannot be maintained, and semiconductor wafers per lot, e.g., as many as 100 wafers, can become entirely defective.

More particularly, a batch-scheme heat-treating apparatus is usually designed to be able to treat 100 to 200 semiconductor wafers per lot at a time. If all the semiconductor wafers of one lot become defective, a serious economical loss is caused.

During the heat treatment described above, assume that it is detected by some means that a thermocouple is damaged. It is impossible to stop the operation immediately and replace the damaged thermocouple with a normal thermocouple. Consequently, even if the damaged thermocouple is replaced, the semiconductor wafers may be inappropriately treated.

The voltage of a temperature detection signal obtained by a thermocouple, as described above, is as very low as between 10° and $20\mu V/°$ C. (about 10.5 mV at 1,000° C.). Therefore, the temperature detection signal is usually amplified by a DC amplifier to about several hundreds of times and supplied to an analog/digital (A/D) converter, and the temperature is measured based on the output of the A/D converter.

The output signal from the A/D converter based on the temperature detection signal obtained by a thermocouple, as described above, includes many noise components. It is especially influenced by the noise of the power supply of the AC power to be supplied to the heater. In addition, the temperature detection signal from a thermocouple has a very low voltage, as described above. Therefore, the measurement precision, and hence the temperature control precision, are largely degraded by the noise components.

In an ordinary heat-treating apparatus, after a temperature detection signal is amplified, it is filtered by, e.g., an RC filter comprising a resistor and a capacitor, in order to remove its noise components. In this method, however, when a filter having a capacitor of a large capacitance enough to provide a sufficient noise removing effect is used, a practical response characteristic as the heat-treating apparatus cannot be obtained. On the other hand, with a filter that can provide a practical response characteristic, high-precision temperature measurement and control cannot be achieved, and the objects to be treated become defective, resulting in an economical loss.

As described above, the temperature detection signals from the plurality of thermocouples are sequentially switched by, e.g., a multiplexer and supplied to a measuring circuit, thereby performing respective temperature measurements.

However, during temperature measurement of a plurality of positions, when the detection signals are switched by, e.g., the multiplexer as described above, a measurement error can be easily caused by, e.g., a temperature change in an ON or OFF resistance of the multiplexer, a thermo electromotive force generated by the metal heterojunction of a connector, or a drift of the amplifier caused during amplification of a detection signal. Especially, in the temperature measurement by the thermocouple, the temperature detection signal has a very small rate of increase in voltage between about 10 and 20 $\mu V/°$ C. Therefore, even a slight thermo electromotive force can result in a very large measurement error. As a result, high-precision temperature measurement and control cannot be performed only by means of switching by a multiplexer, and the objects to be treated inevitably become defective, resulting in an economical loss.

These apply not only to a heat treatment of a wafer in the manufacturing process of a semiconductor device, but also to a heat treatment of an LCD base member in the manufacturing process of an LCD.

SUMMARY OF THE INVENTION

It is, therefore, an object of the present invention to provide a new and improved heat-treating apparatus in which even when a temperature detector such as a thermocouple is damaged, a normal operation can be continuously performed without causing an abnormality in temperature measurement and control As a result, an appropriate heat treatment of an object to be treated is guaranteed, and an economical loss is prevented.

It is, therefore, another object of the present invention to provide a new and improved heat-treating apparatus in which, in particular, a measurement error caused by the noise component of a power source of an AC power which is to be supplied to a heater is prevented, so that accurate temperature measurement and control are enabled, and a practical response characteristic can be obtained. As a result, an appropriate heat treatment of an object to be treated is guaranteed, and an economical loss is prevented.

It is, therefore, still another object of the present invention to provide a new and improved heat-treating apparatus in which a measurement error, which is caused by, e.g., a temperature change of an ON or OFF resistance of a multiplexer for switching a plurality of temperature detection signals, a thermo electromotive force caused at a metal heterojunction of a connector, or a drift in an amplifier for amplifying a temperature detection signal, is compensated for to enable accurate and easy temperature measurement and control at a plurality of positions. As a result, an appropriate heat treatment of an object to be treated is guaranteed, and an economical loss is prevented.

According to a first aspect of the present invention, there is provided an apparatus for heat-treating a multiple of objects such as a plate or the like, with a batch scheme, the apparatus comprising:

a reaction chamber for housing the multiple of the objects to be treated;

electrical heater means, provided outside of the reaction chamber, for heat-treating the multiple of objects to be treated at a predetermined temperature;

temperature detecting means for detecting a temperature within the reaction chamber and having main and reserve temperature detectors;

damage detecting means for detecting damage to the main and reserve temperature detectors; and control means for controlling the electrical heater means normally in accordance with a detection output from the main temperature detector of the temperature detecting means, and when the damage of the main temperature detector is detected by the damage detecting means, for controlling the electrical heater means in accordance with a detection output from the reserve temperature detector of the temperature detecting means In the heat-treating apparatus according to the first aspect of the present invention, the temperature detecting means has main and reserve temperature detectors, and temperature control of the interior of the reaction tube is normally performed in accordance with the detection output obtained by the main temperature detector. Regarding the reserve temperature detector, only temperature measurement is performed in the same manner as by the main temperature detector. Thus, when the main temperature detector is damaged, switching can be instantaneously performed to temperature control by the normal reserve temperature detector. As a result, the temperature inside the reaction tube does not become abnormal at least during heat treatment for a single lot.

According to a second aspect of the present invention, there is provided an apparatus for heat-treating a multiple of objects such as a plate or the like, with a batch scheme, the apparatus comprising:

a reaction chamber for housing a multiple of objects to be treated;

electrical heater means, provided outside of the reaction chamber, for heat-treating the multiple of objects to be treated at a predetermined temperature;

heater drive means for supplying a predetermined AC power to the electrical heater means through an AC power source;

temperature detecting means for outputting a detection signal corresponding to a temperature within the reaction chamber;

A/D converting means for converting the detection signal from the temperature detecting means into digital signals every predetermined sample period;

control means for providing, to the A/D converting means, a sample period synchronized with a frequency of the AC power source as the predetermined sample period, and controlling the heater drive means in accordance with an output obtained by averaging the digital signals from the A/D converting mean in synchronism with the frequency of the AC power source.

In the heat-treating apparatus of the second aspect of the present invention, the detection signal from the temperature detector, e.g., a thermocouple, is digitized every sample period which is synchronized with the power source frequency of the AC power to be applied to the electrical heater means, and the obtained digital signals are averaged. As a result, the influence of the power source noise, which particularly poses problems, can be removed, and accurate temperature measurement and control can be performed. In addition, since the noise components are removed by averaging of the digital signals, which is an operation by a control system, a sufficiently practical response speed can be obtained.

According to a third aspect of the present invention, there is provided an apparatus for heat-treating a multiple of objects such as a pate or the like, with a batch scheme, the apparatus comprising:

a reaction chamber for housing the multiple of objects to be treated;

electrical heater means, provided outside of the reaction chamber, for heat-treating the multiple of objects to be treated at a predetermined temperature;

temperature detecting means for detecting a temperature within the reaction chamber reference temperature signal providing means for providing at least two reference signals corresponding to different temperatures; and control means for controlling the electrical heater means in accordance with an output obtained such that a detection output from the temperature detecting means is corrected based on the two reference temperature signals.

In the heat-treating apparatus of the third aspect of the present invention, at least two reference temperature signals are input to the control means in addition to the detection signal from the temperature detecting means, and the detection signal is corrected based on the two reference temperature signals, thereby canceling the error caused by the signal line. In other words, since the detection signal is corrected based on at least two reference temperature signals, accurate temperature measurement and control can be performed. In addition, this accurate temperature measurement can be performed only by inputting the two reference temperature signals to the control means together with the detection signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Reference will now be made in detail to the presently preferred embodiments of the invention as illustrated in the accompanying drawings, in which like reference characters designate like or corresponding parts throughout the several drawings.

The first embodiment of a heat-treating apparatus of the present invention, which is applied to a batch-scheme heat treatment of a semiconductor wafer, will be described with reference to the accompanying drawings.

Figure 1:
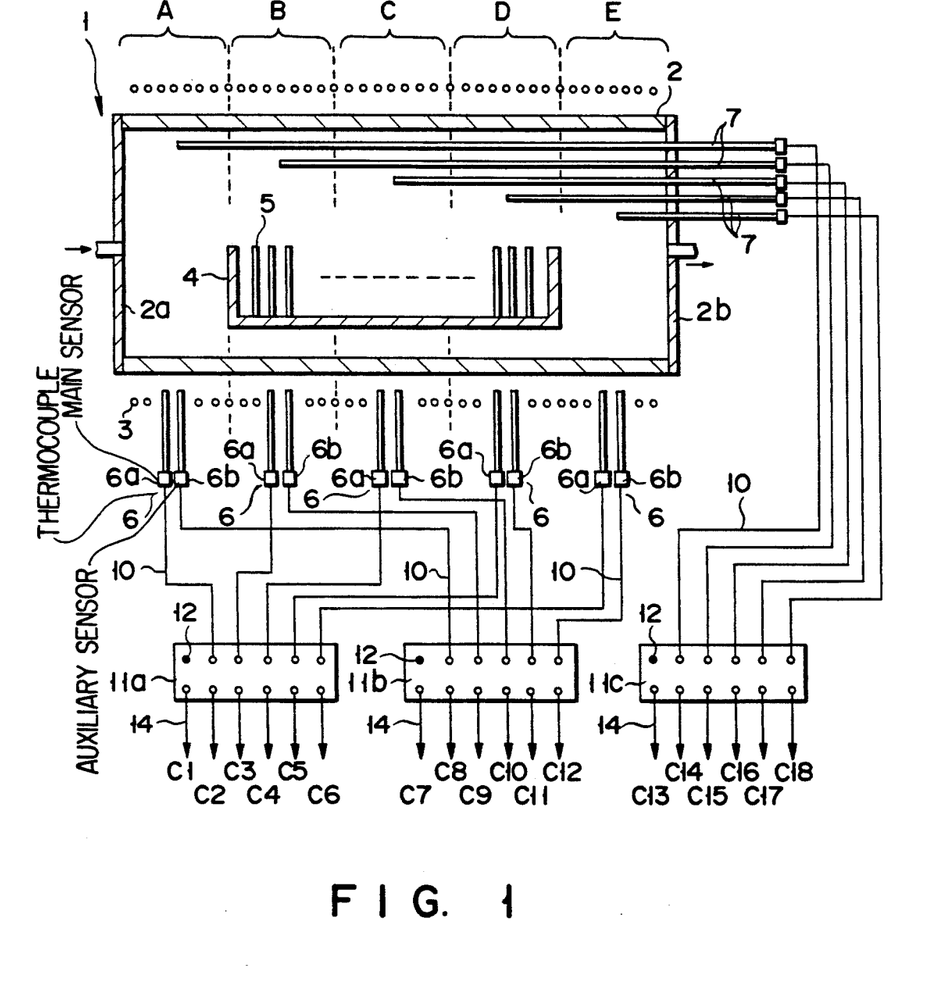
FIG. 1 is a view schematically showing the arrangement of a batch-scheme heat-treating apparatus according to the first embodiment of the present invention.

As shown in FIG. 1, a batch-scheme heat-treating apparatus 1 of this embodiment is obtained by winding a coil heater 3 around a reaction tube 2 comprising, e.g., a quartz cylinder. A multiple of semiconductor wafers 5 loaded on, e.g., a wafer boat 4, are housed in the reaction tube 2 and are subjected to a heat treatment in a predetermined gas atmosphere at a predetermined temperature. Referring to FIG. 1, reference numerals 2a and 2b denote covers provided to two ends of the reaction tube 2 and having reaction gas inlet and outlet, respectively.

The heat-treating apparatus 1 employs a 5-zone temperature control method. According to this method, the interior of the reaction tube 2 is divided into five zones A, B, C, D, and E in its longitudinal direction. The AC power to be supplied to the heater 3 is controlled in units of zones, and the temperature inside the reaction tube 2 is thus controlled in units of zones.

In order to practice this 5-zone temperature. control method, external temperature detectors, e.g., thermocouples 6, are respectively provided in the zones A, B, C, D, and E near the heater 3 outside the reaction tube 2. Internal temperature detectors, e.g., thermocouples 7, are also provided in the zones A, B, C, D, and E, respectively, inside the reaction tube 2.

Figure 2:
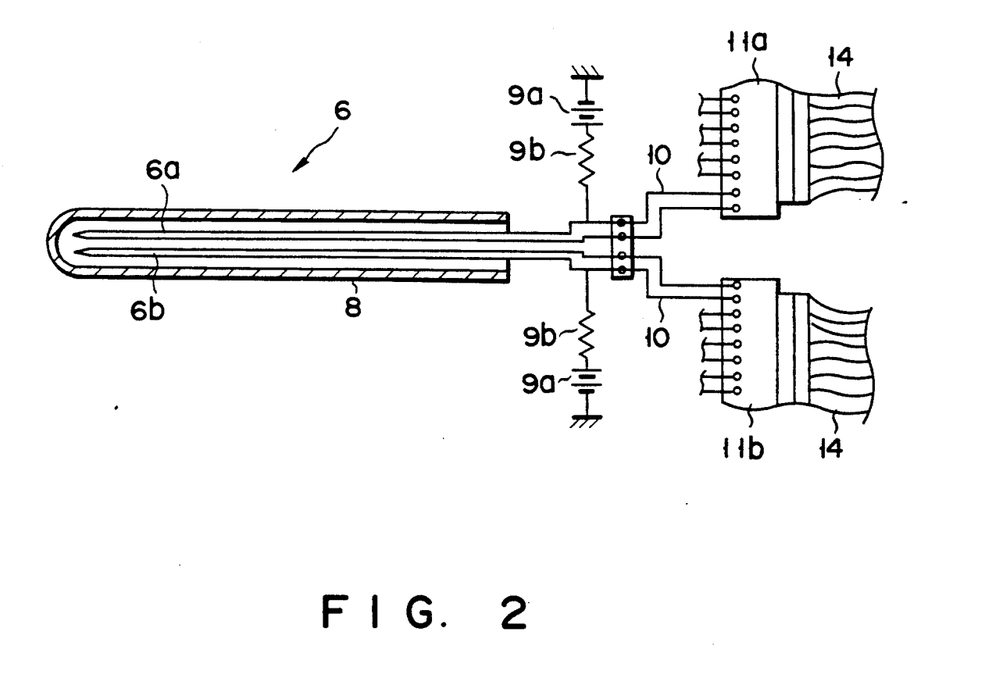
FIG. 2 is a view showing the arrangement of an external thermocouple shown in FIG. 1.

Each external thermocouple 6 has main and reserve thermocouples 6a and 6b, as shown in FIG. 2. The main and reserve thermocouples 6a and 6b are housed in a single protection tube 8 so that they can perform substantially the same temperature measurement. The thermocouples 6a and 6b are respectively connected to power sources 9a through resistors 9b of several tens of $M\Omega$. Thus, when the thermocouple 6a or 6b is disconnected, a predetermined voltage is applied to the wiring of the remaining thermocouple.

The thermocouples 6a, 6b, and 7 are respectively connected to connectors 11a, 11b, and 11c each serving as the cold junction of the given thermocouples, through compensating wires 10. Of the external thermocouples 6, the main thermocouples 6a are connected to the first connector 11a, and the reserve thermocouples 6b are connected to the second connector 11b. The internal thermocouples 7 are connected to the third connector 11c.

The connectors 11a, 11b, and 11c respectively have compensating temperature sensors 12 for measuring the temperatures of themselves.

Figure 3:
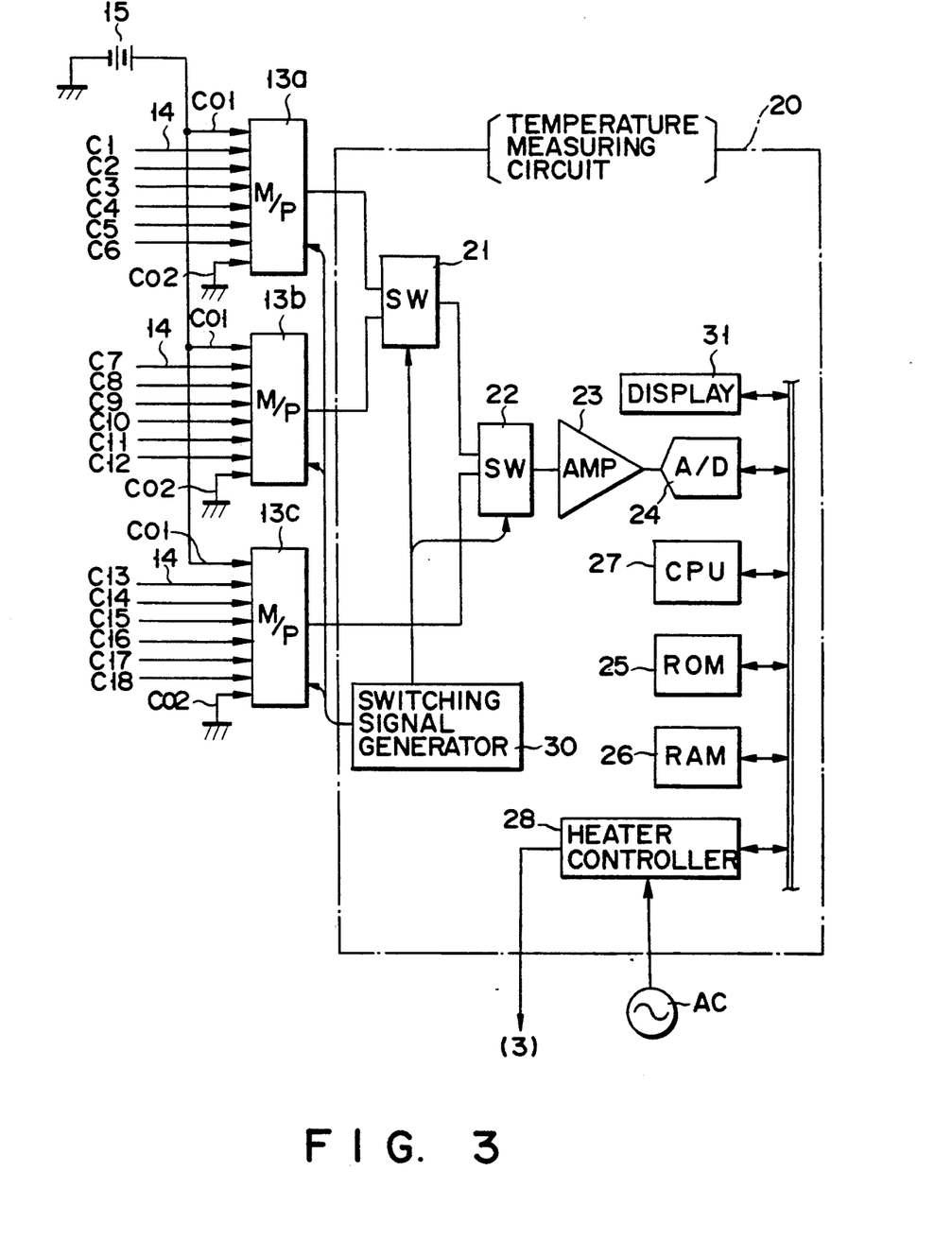
FIG. 3 is a view showing a temperature measuring circuit for the arrangement shown in FIG. 1.

As shown in FIG. 3, the detection signals from the thermocouples 6a, 6b, and 7 are supplied to signal switching means, e.g., semiconductor analog multiplexers 13a, 13b, and 13c, respectively, together with output signals from the compensating temperature sensors 12, via normal conductive wires, e.g., flat cables 14. The multiplexers 13a, 13b, and 13c also receive two reference (temperature) signals, e.g., a voltage $C_{01}$ corresponding to a maximum temperature according to an object to be measured, and a zero voltage $C_{02}$, together with the detection signals from the thermocouples 6a, 6b, and 7. The reference signals $C_{01}$ and $C_{02}$ are used to calibrate a temperature measuring circuit 20 to be described later.

The multiplexers 13a, 13b, and 13c are connected to the temperature measuring circuit 20. Detection signals $C_1$ to $C_{18}$ and the like from the thermocouples 6a, 6b, and 7 are input to the multiplexers 13 and switched, and are sequentially supplied to the temperature measuring circuit 20.

The temperature measuring circuit 20 has switches 21 and 22, an amplifier 23, an A/D converter 24, a readonly memory (ROM) 25, a random access memory (RAM) 26, a central processing unit (CPU) 27, a heater controller 28, a switching signal generator 30, and the like. The switches 21 and 22 switch the signals from the three multiplexers 13a, 13b, and 13c. The amplifier 23 amplifies a detection signal and the like. The ROM 25 stores an arithmetic equation for converting a detection signal or a reference signal to a temperature, and an arithmetic equation for correcting a voltage, obtained by temperature measurement, on the basis of the reference signals $C_{01}$ and $C_{02}$ The RAM 26 temporarily stores an output value obtained during these arithmetic processes. The CPU 27 corrects a detection signal in accordance with the arithmetic equation stored in the ROM 25, converts it to a temperature, and outputs it as a measured temperature. The CPU 27 also outputs an instruction signal and the like of a power to be applied to the heater 3 based on the measured temperature. In addition, the CPU 27 determines that temperature control is to be performed based on a measured temperature obtained by one of the main and reserve thermocouples 6a and 6b of an external thermocouple 6. The heater controller 28 includes a thyristor for controlling the AC power to be applied to the heater 3 from an AC power source AC in accordance with the instruction signal. The switching signal generator 30 supplies a switching signal to the multiplexers 13a, 13b, and 13c, and the switches 21 and 22.

Temperature correction described above can be performed by, e.g., a proportional calculation on the basis of a difference between an output voltage when the reference signals $C_{01}$ and $C_{02}$ are measured and a voltage corresponding to a measured temperature.

Temperature control using the main and reserve thermocouples 6a and 6b will be described.

The detection signals $C_1$ to $C_{18}$ are switched by the multiplexers 13 at, e.g., such a switching period that all the detection signals are input within one second, and are sequentially supplied to the temperature measuring circuit 20. Temperature measurement by the temperature measuring circuit 20 is performed in the following manner. First, temperature measurement is performed based on the detection signals ($C_2$ to $C_6$) from the external main thermocouples 6a respectively provided to the zones A, B, C, D, and E that are obtained by dividing the reaction tube 2 in the longitudinal direction. Temperature measurement is then performed based on the detection signals ($C_8$ to $C_{12}$) from the external reserve thermocouples 6b respectively provided to the zones A, B, C, D, and E. Thereafter, temperature measurement is performed based on the detection signals ($C_{14}$ to $C_{18}$) from the internal thermocouples 7 respectively provided to the zones A, B, C, D, and E.

In this manner, temperature measurement by the external thermocouples 6 is constantly performed by their main and reserve thermocouples 6a and 6b.

Figure 4:
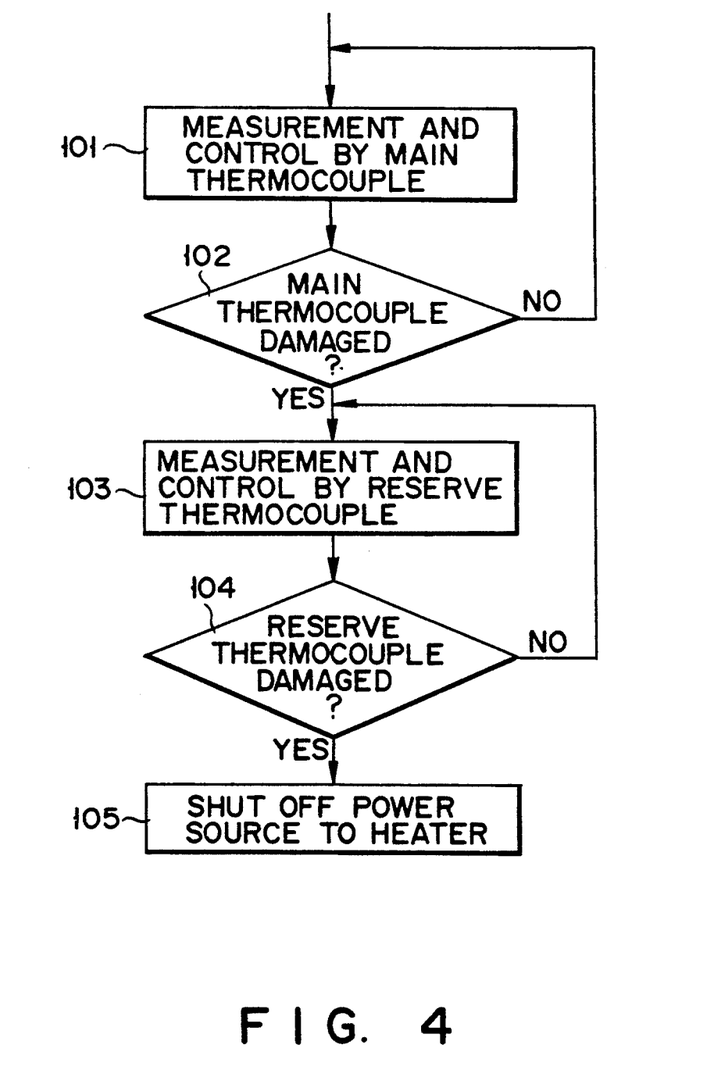
FIG. 4 is a flow chart showing the steps of temperature measurement and control performed by means of switching between main and reserve thermocouples shown in FIG. 1.

It is controlled by the CPU 27 that temperature measurement and control by the external thermocouples 6 are normally performed by their main thermocouples 6a, as shown in the flow chart of FIG. 4 (step 101). When temperature measurement is performed based on the detection signals ($C_2$ to $C_6$) from the external main thermocouples 6a, it is determined whether any one of the external main thermocouples 6a is damaged or not (step 102).

If any single external main thermocouple 6a is damaged, it is automatically switched to a corresponding external reserve thermocouple 6b by the CPU 27 so that temperature control is performed based on a measured temperature in accordance with a detection signal ($C_8$ to $C_{12}$) from the external reserve thermocouple 6b (step 103). When a main thermocouple 6a is disconnected, abnormally high temperature data based on the voltage of the power source 9a is output. When the main thermocouple 6a is short-circuited, no thermo electromotive force is generated and temperature data representing substantially the room temperature is output. As a result, whether any single external main thermocouple 6a is damaged or not can be instantaneously determined from an abrupt temperature change in accordance with predetermined processing by the CPU 27.

In this manner, when any single external main thermocouple 6a is damaged, temperature control is performed by the corresponding external reserve thermocouple 6b. When temperature control is performed by the external reserve thermocouples 6b, it is determined whether any one of the thermocouples 6b is damaged or not (step 104). When both the external main thermocouple 6a and the corresponding external reserve thermocouple 6b are damaged, power supply to the heater 3 is shut off by the CPU 27 in accordance with predetermined processing (step 105). It must be noted that a probability with which both the main thermocouple 6a and the corresponding reserve thermocouple 6b are damaged while a heat treatment for a single semiconductor wafer lot is being performed is usually very low.

When the main thermocouple 6a is damaged, this fact is displayed on a display 31 of the temperature measuring circuit 20 by the CPU 27 in accordance with predetermined processing.

Temperature control of the interior of the reaction tube 2 by the external and internal thermocouples 6 and 7, described above, is performed in the following manner. For example, the average of an output temperature value obtained by a given internal thermocouple 7 and an output temperature value obtained by a corresponding external thermocouple 6 is calculated in accordance with a predetermined ratio, and the power to be supplied to the heater 3 is controlled in accordance with the obtained average.

Note that the technique for temperature measurement and control as described above is described in detail in U.S. Pat. No. 4,711,989, for example.

In this manner, in the heat-treating apparatus of this embodiment, each external thermocouple 6 consists of the main and reserve thermocouples 6a and 6b, and temperature measurement is performed by both the main and reserve thermocouples 6a and 6b as required. When a given main thermocouple 6a is damaged, temperature control is instantaneously switched to that by the corresponding reserve thermocouple 6b. Therefore, even if the given main thermocouple 6a is damaged, abnormal power is not supplied to the heater 3, and power supply to the heater need not be shut off, so that a normal operation is constantly and continuously performed.

As a result, in the batch-scheme heat-treating apparatus that treats as many semiconductor wafers as 100 to 200 wafers per lot, occurrence of a defective wafer due to the damage to a thermocouple can be prevented.

When a heat treatment for a given lot is completed, a damaged thermocouple is replaced by a normal thermocouple in accordance with the contents of the display 31, thereby preparing for a heat treatment for the following lot.

Figure 5:
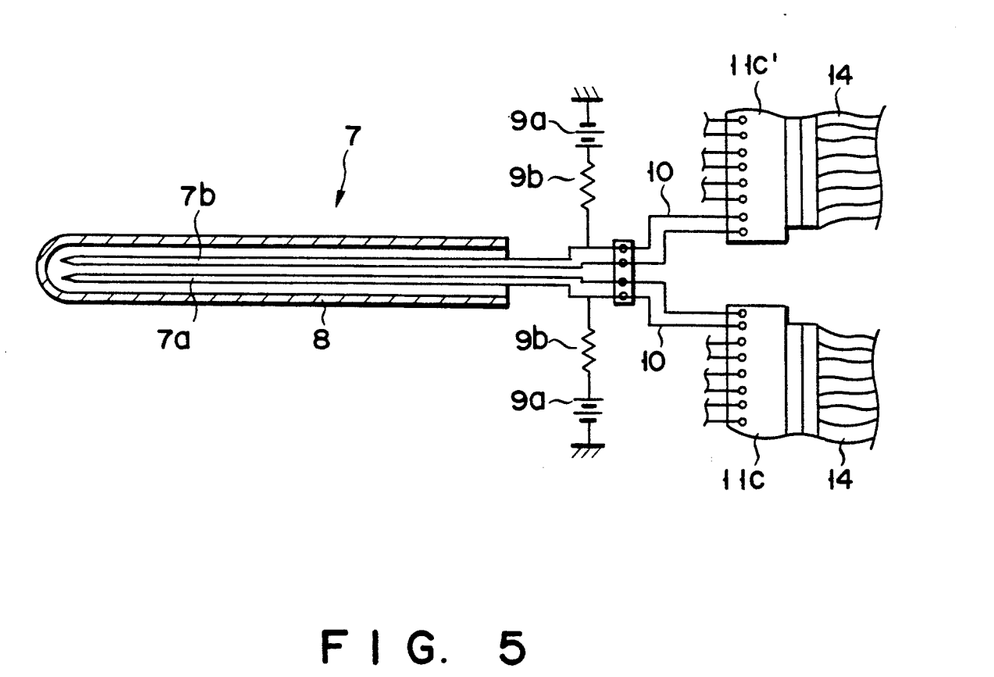
FIG. 5 is a view showing the arrangement of a modification of the internal thermocouple shown in FIG. 1.

In this embodiment, the reserve thermocouples 6b are respectively provided only in the external thermocouples 6. However, it is obvious that main and reserve thermocouples 7a and 7b may be provided to constitute the internal thermocouples 7 in the same manner as in FIG. 2.

As is described above, according to the heat-treating apparatus according to the first embodiment of the present invention, even when the temperature detector such as a thermocouple is damaged, temperature abnormality is not caused and the normal operation can be continuously performed. As a result, it is possible to prevent many defective wafers, leading to an economical loss, from being produced due to the damage to the temperature detector.

A heat-treating apparatus according to the second embodiment of the present invention will be described.

Figure 6:
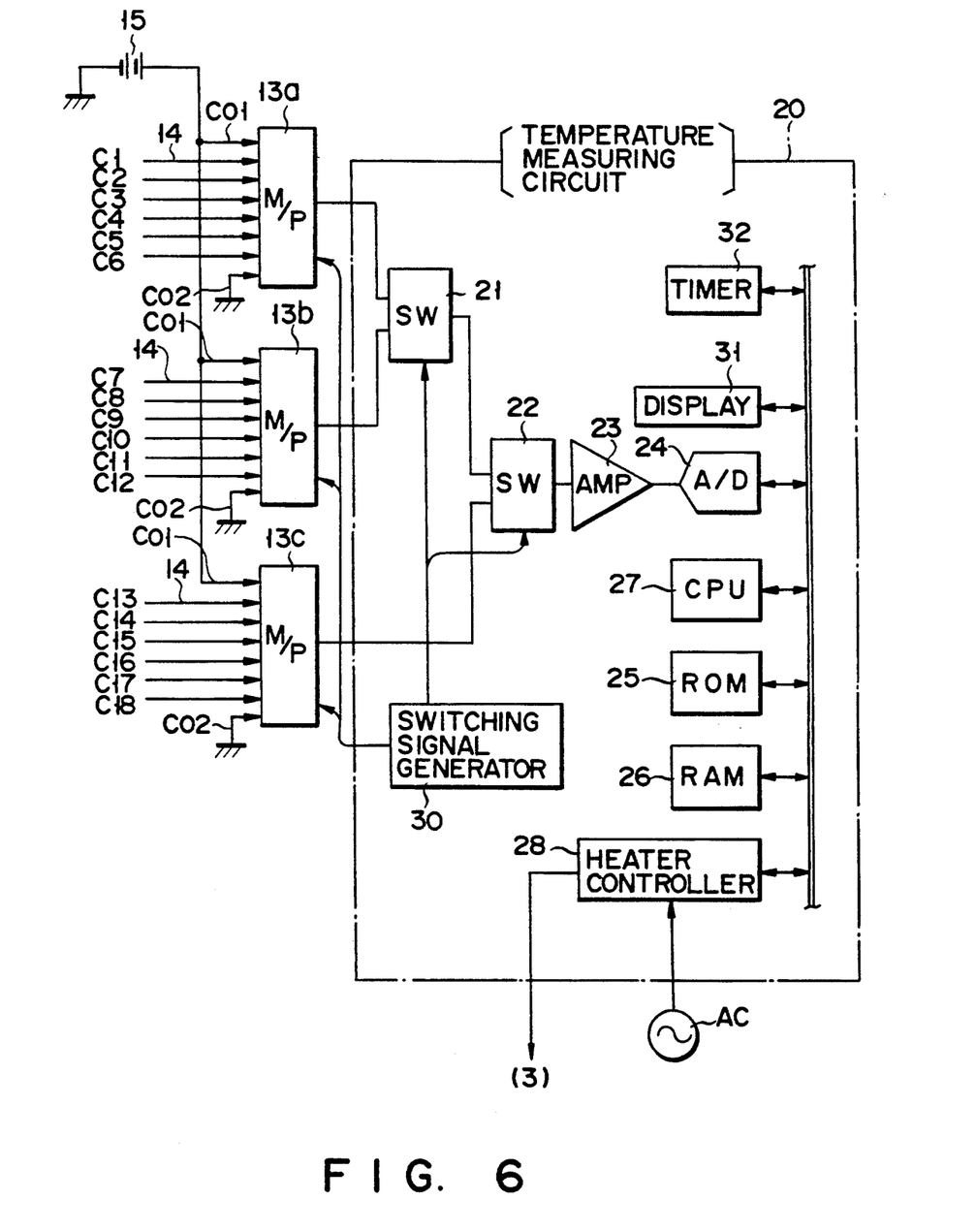
FIG. 6 is a view showing a temperature measuring circuit used in the second embodiment of the present invention.

More specifically, the second embodiment is directed especially to a batch-scheme heat-treating apparatus that can prevent a temperature measurement error caused by a noise component from a power source of an AC power applied to the heater, as described above. The arrangement of the apparatus itself is similar to that of the first embodiment (FIG. 1). Its only difference from the first embodiment (FIG. 1) is that a timer 32 is added to a temperature measuring circuit 20, as shown in FIG. 6.

The timer 32 determines the sample period of the output from an A/D converter 24 in order that this output is obtained as a sample period synchronized with the power source frequency of an AC power source AC.

Averaging of detection signals by using the timer 32 and the like and noise removal by the averaging will be described.

Detection signals $C_1$ to $C_{18}$ are switched by multiplexers 13a, 13b, and 13c and are sequentially supplied to the temperature measuring circuit 20. A detection signal $C_n$ supplied to the temperature measuring circuit 20 is amplified by an amplifier 23.

Figure 7:
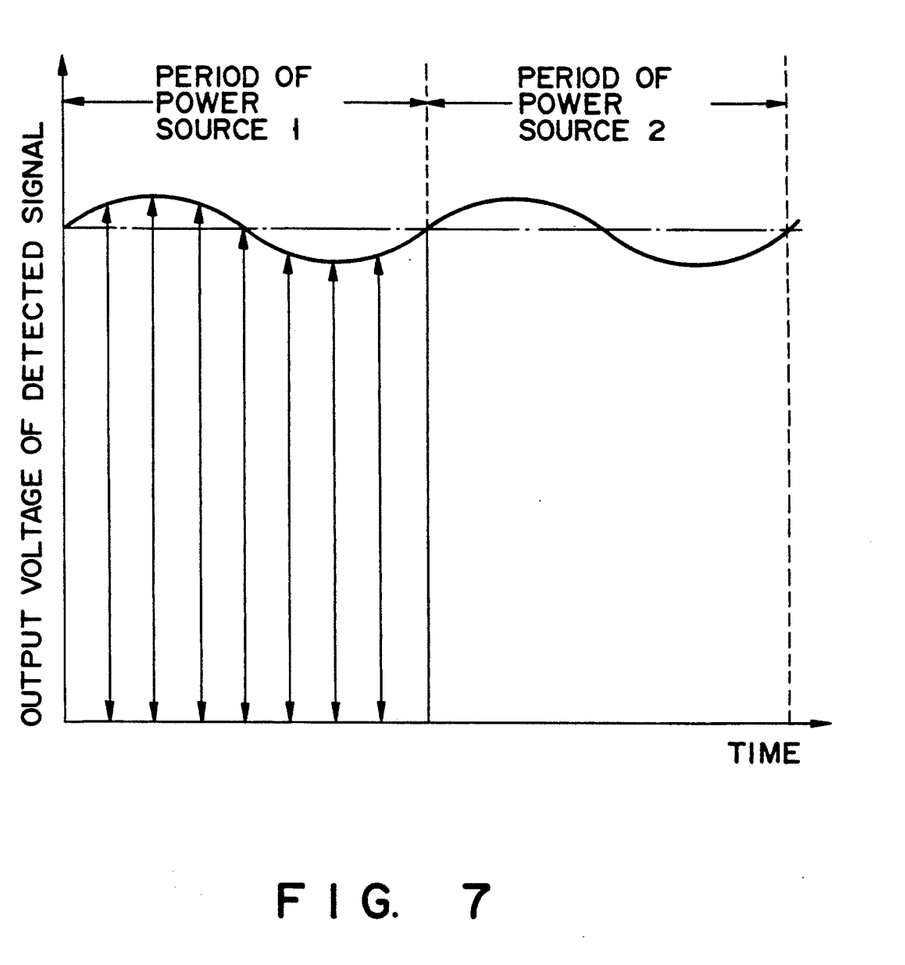
FIG. 7 schematically shows an output waveform of an amplified detection signal of FIG. 6 together with its sampling period.

An amplified output voltage (detection signal) includes many noise components. It is especially largely influenced by the noise component of the power source frequency of the AC power applied to a heater 3, as shown in FIG. 7. Therefore, when the amplified output voltage (detection signal) is to be digitized, it is digitized in synchronism with the power source frequency so as to provide a plurality of samples. The number of samples is appropriately determined. For example, eight samples are obtained per cycle of the power source frequency, and this sampling is performed for two cycles. This sample period is determined by the timer 32. Assuming eight samples per cycle, as described above the sample period for 50-Hz commercial frequency is 2.5 ms, and the sample period for 60-Hz commercial frequency is approximately 2.08 ms.

Thereafter, 16 (=8×2) sample output values are subjected to calculation of the arithmetic mean by a CPU 27. As a result, the influence of the power noise is largely decreased, and a detection signal amplified in accordance with only the original detection signal component can be obtained. When a measured temperature is calculated by the CPU 27 based on the detection signal, from which the noise components are removed, and is output, very accurate temperature measurement and control can be performed.

As described above, a measured temperature based on a detection signal $C_n$ is output after averaging in accordance with sample signals. The next detection signal $C_{n+1}$ is then subjected to calculation. Temperature measurement based on the respective detection signals $C_1$ to $C_{18}$ is performed in this manner.

The above temperature control of the interior of the reaction tube 2 by external temperature detectors 6a and 6b and a corresponding internal temperature detector 7 is performed by, e.g., calculating an average of an output temperature value from the internal temperature detector 7 and an output temperature value from the external temperature detectors 6a and 6b in accordance with a predetermined ratio and controlling the power to be supplied to a heater 3, in the same manner as in the first embodiment.

In this manner, in the heat-treating apparatus 1 of the second embodiment, the detection signals from the thermocouples 6a, 6b, and 7 or 6a, 6b, 7a, and 7b are amplified and digitized in accordance with the sample period determined to be in synchronism with the power source frequency. The plurality of sample signals are averaged and a measured temperature is output. Therefore, the influence of the power source noise is largely decreased to enable accurate temperature measurement. As a result, temperature control of the reaction tube 2 can be performed more accurately.

Since the noise components are removed by means of a digital control system as described above, the response characteristic is not degraded is in the case of using a conventional RC filter. As a result, even when temperature measurements at a plurality of positions are to be performed while switching by multiplexers, as described above, high-speed measurements can be performed.

As has been described according the heat-treating apparatus of the second embodiment of the present invention, the influence of the power source noise that particularly poses problems can be removed without degrading the response characteristic. Hence, high-precision temperature measurement and control can be performed while maintaining a practical response characteristic. As a result, an economical loss caused by a defective lot can be prevented.

A heat-treating apparatus according to the third embodiment of the present invention will be described.

More specifically, this embodiment is particularly directed to a batch-scheme heat-treating apparatus that can compensate for a measurement error caused by a temperature change in a multiplexer as described above, a thermo electromotive force from a connector, a drift in an amplifier, and the like. The arrangement of the apparatus itself and that of a temperature measuring circuit are the same as those of the first (FIGS. 1 and 3) and second (FIG. 6) embodiments. The characteristic feature of the third embodiment resides in that reference signals $C_{01}$ and $C_{02}$ are utilized to perform temperature correction, thereby compensating for the measurement error described above.

The multiplexers 13a, 13b, and 13c receive at least two reference signals $C_{01}$ and $C_{02}$ in addition to the detection signals from the thermocouples 6a, 6b, and 7 (or 6a, 6b, 7a, and 7b).

As the reference signals $C_{01}$ and $C_{02}$, e.g., a voltage corresponding to a maximum temperature in accordance with the target to be measured and a zero voltage are used. In this embodiment, the temperature measuring range is between room temperature and 1399.9° c. The input terminal of the reference signal $C_{01}$ is connected to a reference power source 15 of +16.2 mV corresponding to about 1,412° which is higher than the maximum measurable temperature, and the input terminal of the reference signal $C_{02}$ is connected to the ground potential (refer to FIGS. 3 and 6). However, the number of reference signals is not limited to two. When the number of the reference signals is increased, a more accurate measurement can be expected. However, it will cause a decrease in the number of input signals to be measured. Hence, two reference signals are usually sufficient.

Temperature measurement using detection signals $C_1$ to $C_{18}$ from the thermocouples $6a$, $6b$, and 7 (or $6a$, $6b$, $7a$, and $7b$) that utilize the reference signals $C_{01}$ and $C_{02}$ will be described.

When the reference signals $C_{01}$ and $C_{02}$ are switched by the multiplexers $13a$, $13b$, and $13c$ and are sequentially supplied to a temperature detecting circuit 20 in addition to the detection signals $C_1$ to $C_{18}$, voltages based on the reference signals $C_{01}$ and $C_{02}$ are output.

Figure 8:
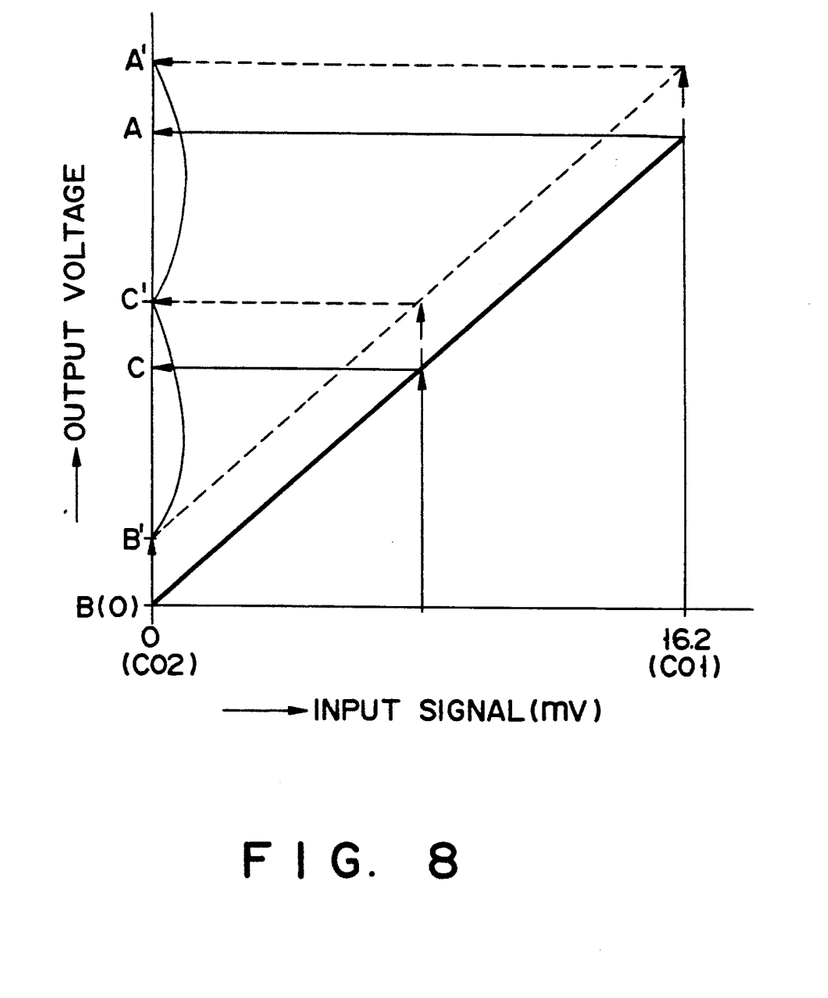
FIG. 8 is a view for explaining a temperature correcting technique by the third embodiment of the present invention.

At this time, as shown in FIG. 8, if the output voltages based on the reference signals $C_{01}$ and $C_{02}$ are predetermined voltages A and B, a voltage C corresponding to a temperature based on the detection signals $C_1$ to $C_{18}$ is directly output as a voltage corresponding to a measured temperature. On the other hand, assume that the voltages based on the reference signals $C_{01}$ and $C_{02}$ are deviated from the predetermined voltages A and B due to, e.g., variations in ON or OFF resistance, a thermo electromotive force generated in a metal heterojunction of a connector $11a$, $11b$, or $11c$, or a temperature drift in the gain of a detection signal amplifier 23, and are measured as voltages A' and B'. In this case, the output voltage based on the detection signals $C_1$ to $C_{18}$ is corrected in accordance with the difference between the set voltage A and the measured voltage A' and the difference between the set voltage B and the measured voltage B'. Then, e.g., a voltage C' before correction is corrected and output as a voltage C.

This temperature correction can be performed by, e.g., a proportional calculation based on the difference between the voltages A' and A and the difference between the voltages B' and B, the voltages A' and B' being measured by using the reference signals $C_{01}$ and $C_{02}$. Such temperature correction may be performed by sequentially inputting the reference signals $C_{01}$ and $C_{02}$ together with the detection signals $C_1$ to $C_{18}$, or may be performed by, e.g., calibrating the temperature measuring circuit 20 every second.

As a result of temperature correction described above, errors in the detection signals $C_1$ to $C_{18}$ from the thermocouples $6a$, $6b$, and 7 ($6a$, $6b$, $7a$, and $7b$) caused by, e.g., a temperature drift in a signal line and the like are corrected, and accurate temperatures are output.

Temperature control of the interior of the reaction tube 2, described above, by external temperature detectors $6a$ and $6b$ and an internal temperature detector 7 (or detectors $7a$ and $7b$) is performed in the following manner. An average of the output temperature value of the internal temperature detector 7 (or detectors $7a$ and $7b$) and the output temperature value of the external temperature detectors $6a$ and $6b$ is calculated in accordance with a predetermined ratio in the same manner as in the first and second embodiments. Then, the power to be applied to the heater 3 is controlled in accordance with the obtained average.

In this manner, in the heat-treating apparatus of the third embodiment, the two reference signals $C_{01}$ and $C_{02}$ are input to each of the multiplexers $13a$, $13b$, an $13c$, in addition to the detection signals $C_1$ to $C_{18}$ from the plurality of thermocouples $6a$, $6b$, and 7 (or $6a$, $6b$, $7a$, and $7b$), and the temperature measuring circuit 20 is calibrated based on the output temperature obtained in accordance with the reference signals $C_{01}$ and $C_{02}$. Therefore, an error in a detection signal which has occurred after the detection signal is input to the multiplexer $13a$, $13b$, or $13c$ and before digitized by the A/D converter 24 is corrected, and accurate temperature measurement can be performed, resulting in a further precise temperature control of the reaction tube 2.

Since this accurate temperature measurement can be performed by a simple operation of inputting the two reference signals $C_{01}$ and $C_{02}$ to each of the multiplexers $13a$, $13b$, and $13c$, in addition to the detection signals $C_1$ to $C_{18}$, a load to the apparatus is minimum.

As has been described above, according to the heat-treating apparatus of the third embodiment of the present invention, when, e.g., temperature measurements at a plurality of positions are to be sequentially performed by using the signal switching means, temperature measurement and control at each position can be accurately and easily performed by compensating for a measurement error by using at least two reference signals.

In the embodiments described above, the object to be treated is a semiconductor wafer. However, the present invention is not limited to this. The present invention is similarly applicable when a multiple of thin plate-like members or the base members of the LCDs are to be heat-treated as the object to be treated.

In the embodiments described above, the reaction tube 2 is of a lateral type. However, the reaction tube 2 is not limited to this but can be of a vertical type. A vertical reaction tube is described in detail in U.S. Pat. No. 4,954,684 which is assigned to the same assignee.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. An apparatus for heat-treating a multiple of objects such as a plate or the like, with a batch scheme, said apparatus comprising:

a reaction chamber for housing a multiple of objects to be treated;

electrical heater means, provided outside of said reaction chamber, for heat-treating the multiple of objects to be treated at a predetermined temperature;

heater drive means for supplying a predetermined AC power to said electrical heater means through an AC power source;

temperature detecting means for outputting an analog detection signal corresponding to a temperature within said reaction chamber;

A/D converting means for converting the analog detection signal from said temperature detecting means into digital signals wherein a sampling period of the digital signals is synchronized with the frequency of said AC power source so that the sampling period is equal to a 360° cycle of the AC power source and the number of digital signals included in the sampling period is an integer multiple of two;

memory means for storing the digital signals output from said A/D converting means;

averaging arithmetic means for averaging the digital signals stored in said memory means, over a period of time equal to an integer multiple of said sampling period; and control means for controlling said heater drive means in accordance with an output signal obtained by said averaging arithmetic means upon averaging of the digital signals included in said sampling period.

2. An apparatus according to claim 1, wherein said temperature detecting means includes an external thermocouple provided outside said reaction chamber and an internal thermocouple provided inside said reaction chamber.

3. An apparatus according to claim 2, wherein both said external and internal thermocouples are provided to each of a plurality of zones obtained by dividing said reaction chamber.

4. An apparatus according to claim 3, wherein at least one of said external and internal thermocouples provided to each of said zones comprises main and reserve thermocouples housed in a single protection tube.

5. An apparatus according to claim 4, wherein each of said main and reserve thermocouples is connected to one thermal of a corresponding one of connectors, serving as a cold junction thereof, via a compensating wire.

6. An apparatus according to claim 5, wherein said each of said connectors is provided with a compensating temperature sensor for measuring a temperature of said connector itself.

7. An apparatus according to claim 6, wherein other terminal of each of said connectors is connected to signal switching means, and said signal switching means performs switching between detection signals from said main and reserve thermocouples every predetermined period and supplies a selected detection signal to said control means.

8. An apparatus according to claim 1, wherein said control means includes a timer for determining the sample period, which is to be provided to said A/D converter converting means, to be synchronized with the frequency of said AC power source.

9. An apparatus according to claim 1, wherein said control means includes means for subjecting the digital signals from said A/D converter converting means to arithmetic mean calculation for at least one cycle of the frequency of said power source.

10. An apparatus according to claim 9, wherein the sample period is determined to be 2.5 ms when the frequency of said power source is 50 Hz and to be approximately 2.08 ms when the frequency of said power source is 60 Hz.

11. An apparatus according to claim 1, wherein said temperature detecting means includes a main temperature detector and a reserve temperature detector, said apparatus detector and a reserve temperature detector, said apparatus further comprising damage detecting means for detecting damage to said main and reserve temperature detectors, wherein said control means controls said electrical heater means during normal operation in accordance with a detection output from said main temperature detector of said temperature detecting means, and wherein said control means includes means responsive to damage of said main temperature detector which has been detected by said damage detecting means, for providing control of said electrical heater means in accordance with a detection output from said reserve temperature detector of said temperature detecting means.

12. An apparatus for heat-treating a multiple of objects such as a plate or the like, with a batch scheme, said apparatus comprising:

a reaction chamber for housing the multiple of objects to be treated;

electrical heater means, provided outside of said reaction chamber, for heat-treating the multiple of objects to be treated at a predetermined temperature;

temperature detecting means for detecting a temperature within said reaction chamber;

reference temperature voltage providing means for providing at least two fixed reference temperature voltages corresponding to different temperatures;

A/D converting means for converting into digital signals an analog detection signal output from said temperature detecting means and two reference temperature voltages output from said reference temperature voltage providing means;

memory means for storing data representing the digital signals obtained by said A/D converting means; and correcting arithmetic means for correcting data corresponding to a detection output from said temperature detecting means by a proportional calculation, in accordance with data in said memory means which correspond to said two reference temperature voltages; and control means for controlling said electrical heater means in accordance with said data corresponding to the detection output which has been corrected by said correcting arithmetic means.

13. An apparatus according to claim 12, wherein said temperature detecting means includes an external thermocouple provided outside said reaction chamber and an internal thermocouple provided inside said reaction chamber.

14. An apparatus according to claim 13, wherein both said external and internal thermocouples are provided to each of a plurality of zones obtained by dividing said reaction chamber.

15. An apparatus according to claim 14, wherein at least one of said external and internal thermocouples provided to each of said zones comprises main and reserve thermocouples housed in a single protection tube.

16. An apparatus according to claim 15, wherein each of said main and reserve thermocouples is connected to one terminal of a corresponding one of connectors, serving as a cold junction thereof, via a compensating wire.

17. An apparatus according to claim 16, wherein each of said connectors is provided with a compensating temperature sensor for measuring a temperature of said connector itself.

18. An apparatus according to claim 17, wherein the other terminal of each of said connectors is connected to signal switching means, and said signal switching means performs switching between detection signals from said main and reserve thermocouples every predetermined period and supplies a selected detection signal to said control means.

19. An apparatus according to claim 18, wherein said signal switching means includes a multiplexer, and the two reference temperature signals are switched by said multiplexer together with the detection signals from said main and reserve thermocouples and supplied to said control means.

20. An apparatus according to claim 19, wherein said control means includes an amplifier for amplifying an output from said multiplexer, and A/D converting means for A/D-converting an output from said amplifier.

21. An apparatus according to claim 12, wherein one of the two reference temperature voltages provided by said reference temperature voltage providing means corresponds to a value close to a maximum heating temperature of the objects to be treated, and the other one corresponds to a value close to room temperature.

22. An apparatus according to claim 21, wherein one of the two reference temperature voltages is supplied by a reference power source of $+16.2$ mV which corresponds to about 1,412° C., and the other of the two reference signals is supplied as a ground potential corresponding to the value close to the room temperature.

23. An apparatus according to claim 12, wherein said temperature detecting means includes a main temperature detector and a reserve temperature detector, said apparatus further comprising damage detecting means for detecting damage to said main and reserve temperature detectors, wherein said control means controls said electrical heater means during normal operation in accordance with a detection output from said main temperature detector of said temperature detecting means, and wherein said control means includes means responsive to damage of said main temperature detector which has been detected by said damage detecting means, for providing control of said electrical heater means in accordance with a detection output from said reserve temperature detector of said temperature detecting means.

* * * * *